United States Patent
Michiue et al.

(10) Patent No.: US 7,764,722 B2
(45) Date of Patent: Jul. 27, 2010

(54) NITRIDE SEMICONDUCTOR LASER ELEMENT

(75) Inventors: Atsuo Michiue, Komatsushima (JP); Tomonori Morizumi, Anan (JP); Hiroaki Takahashi, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/033,404

(22) Filed: Feb. 19, 2008

(65) Prior Publication Data

US 2008/0205464 A1    Aug. 28, 2008

(30) Foreign Application Priority Data

Feb. 26, 2007    (JP)    ............... 2007-046260
Feb. 28, 2007    (JP)    ............... 2007-048426

(51) Int. Cl.
*H01S 5/00* (2006.01)

(52) U.S. Cl. ................... 372/49.01; 348/335

(58) Field of Classification Search ........... 372/49.01, 372/43.01, 45.01; 257/628
See application file for complete search history.

(56) References Cited

U.S. PATENT DOCUMENTS

| | | | | |
|---|---|---|---|---|
| 4,001,719 A | * | 1/1977 | Krupka | 372/49.01 |
| 4,840,922 A | * | 6/1989 | Kobayashi et al. | 438/29 |
| 4,947,401 A | * | 8/1990 | Hinata et al. | 372/50.12 |
| 5,430,750 A | * | 7/1995 | Tanimoto et al. | 372/49.01 |
| 6,529,537 B2 | * | 3/2003 | Yamanaka | 372/49.01 |
| 6,680,959 B2 | * | 1/2004 | Tanabe et al. | 372/45.01 |
| 6,835,963 B2 | * | 12/2004 | Hatakoshi et al. | 257/98 |
| 7,057,211 B2 | | 6/2006 | Dwilinski et al. | |
| 7,192,851 B2 | | 3/2007 | Yamane et al. | |
| 7,453,130 B2 | * | 11/2008 | Nakai | 257/432 |
| 7,470,558 B2 | * | 12/2008 | Aita et al. | 438/57 |
| 2004/0233950 A1 | | 11/2004 | Furukawa et al. | |
| 2007/0025231 A1 | | 2/2007 | Ochiai et al. | |
| 2007/0205424 A1 | | 9/2007 | Kamikawa et al. | |

FOREIGN PATENT DOCUMENTS

| | | |
|---|---|---|
| EP | 1406360 A | 7/2004 |
| JP | S63-164286 A | 7/1988 |
| JP | H04-079279 A | 3/1992 |
| JP | H09-162496 A | 6/1997 |
| JP | H09-162497 A | 6/1997 |
| JP | H09-283843 A | 10/1997 |
| JP | W10-070338 A | 3/1998 |
| JP | 2002-100830 A | 4/2002 |
| JP | 2002-329926 A | 11/2002 |
| JP | 2002-335053 A | 11/2002 |
| JP | 2004-327637 A | 11/2004 |
| JP | 2005-079406 A | 3/2005 |
| JP | 2005-101457 A | 4/2005 |
| JP | 2006-228892 A | 8/2006 |
| JP | 2007-273951 A | 10/2007 |
| WO | WO-03/036771 A1 | 5/2003 |

* cited by examiner

*Primary Examiner*—Minsun Harvey
*Assistant Examiner*—Tuan N. Nguyen
(74) *Attorney, Agent, or Firm*—Global IP Counselors, LLP

(57) ABSTRACT

A nitride semiconductor laser element has a first nitride semiconductor layer, an active layer, a second nitride semiconductor layer, and a first protective film in contact with a cavity end face of the nitride semiconductor layer, wherein the first protective film in contact with at least the active layer of the cavity end face has a region thinner than the maximum thickness of the first protective film.

22 Claims, 7 Drawing Sheets

NITRIDE SEMICONDUCTOR LASER ELEMENT

BACKGROUND OF THE INVENTION

1. Field of the Invention

The present invention relates to a nitride semiconductor laser element and more particularly relates to a nitride semiconductor laser element having a protective film with an end face of the cavity.

2. Background Information

With a nitride semiconductor laser element, end faces of the cavity formed by RIE (reactive ion etching) or cleavage has narrow bandgap energy, so absorption of the exiting light occurs at the end face, this absorption generates heat at the end face, and problems such as a short service life are encountered in trying to obtain a high-output laser, Consequently, there has been proposed, for example, a method for manufacturing a high-output semiconductor laser in which a silicon oxide or nitride film is formed as a protective film on the cavity end face (see, for example, Japanese Laid-Open Patent Application H9-283843).

Also, a silicon oxide or nitride film is used as a protective film of a cavity end face of a high-output semiconductor laser to form a window structure in the cavity end face, and to suppress optical absorption at the cavity end face (see, for example, Japanese Laid-Open Patent Application H10-70338).

Meanwhile, conventional nitride semiconductor laser elements have employed a method in which the thickness of the protective film formed on the cavity end face is varied according to the density of the emitted light in order to suppress variance in characteristics chip-by-chip (see, for example, Japanese Laid-Open Patent Application 2006-228892).

Also, it has been proposed that to provide periodic refractive index behavior corresponding to a specific wavelength, a stripe structure is employed inside the cavity, unimodality is achieved, for example, an $SiO_2$ film is used as a protective film, and the thickness of the protective film is varied for each stripe (see, for example, Japanese Laid-Open Patent Application H4-79279, S63-164286 and 2002-329926).

Protective films have been tried in a variety of forms in nitride semiconductor laser elements, according to the performance and so forth thereof, such as employing a structure that suppresses optical absorption at the cavity end face, but further improvement is needed to obtain a high-output laser, because heat generation caused by optical absorption still cannot be adequately prevented. Another problem that remains unsolved is that differences in the lattice constant of nitride semiconductor can produce cracks in the nitride semiconductor layer or the protective film, or separation of the protective film which means that these parts are not able to carry out their intended functions.

In other words, because nitride semiconductor laser elements have high optical density, it is necessary to increase their heat dissipation, but if film thickness is increased in order to improve heat dissipation in the formation of a protective film such that oscillated light can be properly reflected or transmitted, a problem is that the protective film is prone to cracking.

SUMMARY OF THE INVENTION

It is an object of the present invention to provide a nitride semiconductor laser element with which cracking of the nitride semiconductor and the protective film is suppressed, there is no separation of the protective film at the end face, the characteristics are good and longer operating life is realized.

The present invention provides a nitride semiconductor laser element having a first nitride semiconductor layer, an active layer, a second nitride semiconductor layer, and a first protective film in contact with a cavity end face of the nitride semiconductor layer, wherein the first protective film in contact with at least the active layer of the cavity end face has a region thinner than the maximum thickness of the first protective film.

Further, the present invention provides another nitride semiconductor laser element having a first nitride semiconductor layer, an active layer, a second nitride semiconductor layer, a first protective film in contact with a cavity end face of the nitride semiconductor layer, and a second protective film formed on the first protective film, wherein the second protective film has a thick part protruding from a face on the cavity end face side and from a face opposite the cavity end face.

With the present invention, a first protective film with good adhesion to the nitride semiconductor layer is formed at the cavity end face, which allows heat dissipation to be maximized, and particularly when the first protective film is formed relatively thick overall, if the first protective film is formed thinner at least at the active layer of the cavity end face, this will lessen the stress between the first protective film and the nitride semiconductor layer that is brought about by the adhesion of the first protective film, and will effectively prevent separation of the first protective film and cracking of the nitride semiconductor layer or a protective film.

In particular, if a second protective film is formed over the first protective film, the adhesion of the first protective film to the nitride semiconductor layer can be further enhanced, and separation of the first protective film can be prevented more effectively. Also, if the second protective film is structured as above, the overall thickness of the second protective film can be kept low while allowing the second protective film to be thick in just the necessary region around the active layer. Consequently, problems caused by making the entire second protective film thicker, such as the second protective film material unnecessary molding itself into the electrode and substrate portions, can be prevented, and the decrease in heat dissipation can also be prevented.

As a result, stable operation can be ensured, and it is possible to provide a high-output nitride semiconductor laser element with high reliability and a higher COD level.

DETAILED DESCRIPTION OF THE PREFERRED EMBODIMENTS

Figure 1:
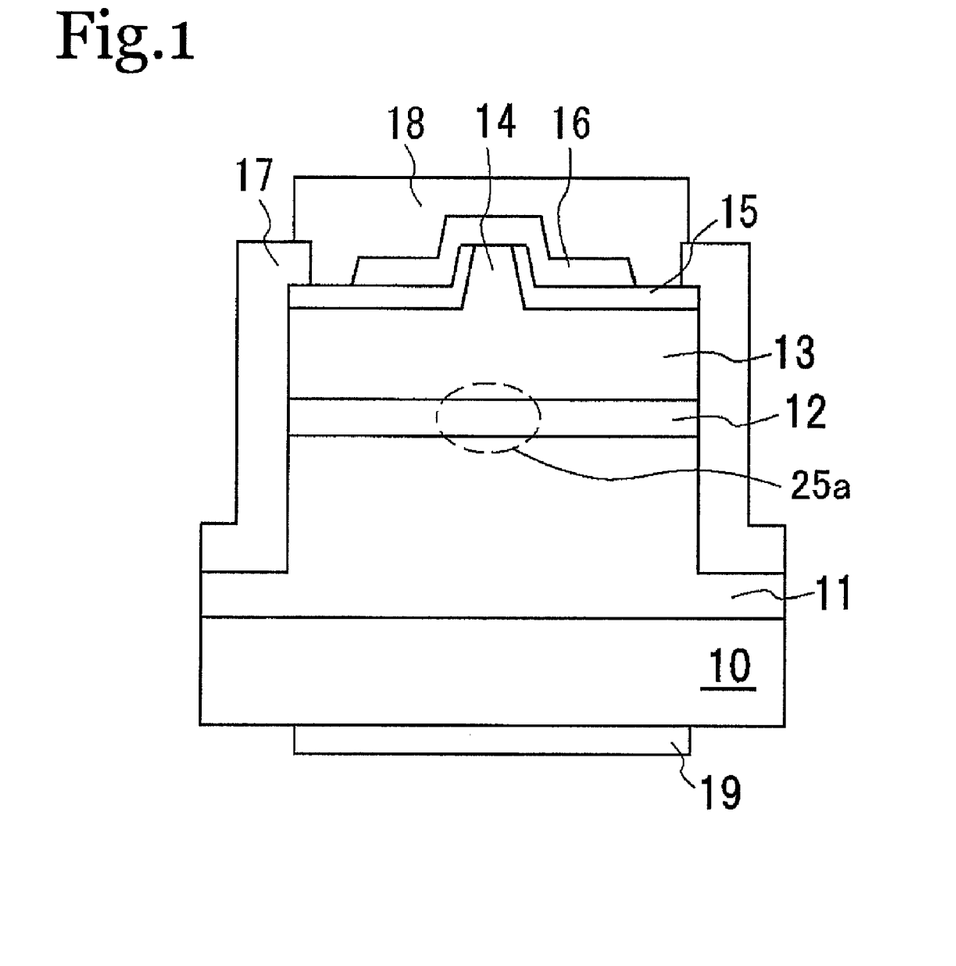
FIG. 1 is simplified cross section illustrating the structure of the laser elements of the present invention.

As typically shown in FIG. 1, for example, the nitride semiconductor laser element of the present invention mainly includes a first nitride semiconductor layer 11, an active layer 12, and a second nitride semiconductor layer 13, and cavity is formed by setting cavity end faces on opposed end faces of the nitride semiconductor layer.

Figure 2A:
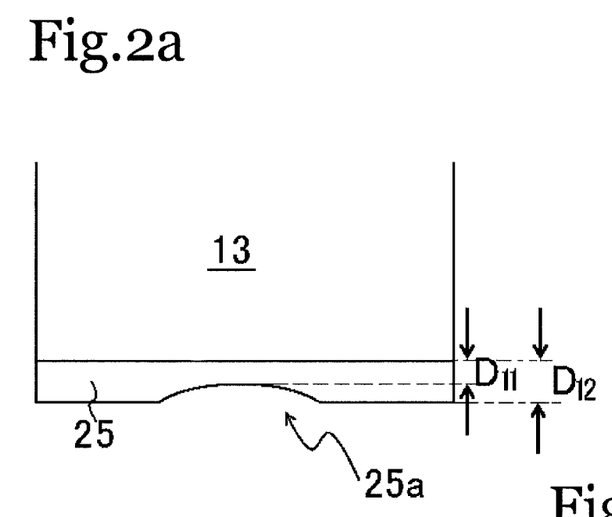
FIGS. 2a to 2c are simplified diagrams around the active layer illustrating the structure of the protective film of the present invention.
Figure 2B:
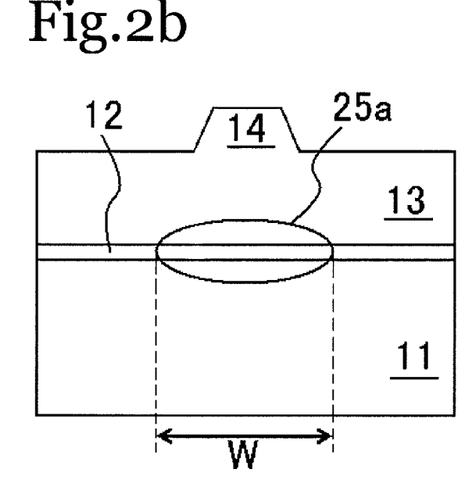
Figure 2C:
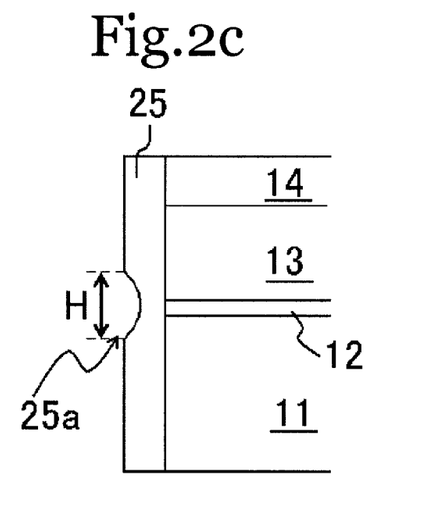

This nitride semiconductor laser element is usually formed on a substrate 10, a ridge 14 is formed on the surface of the second nitride semiconductor layer 13, and a first protective film is formed on whole end faces of the cavity in contact with the end faces (see, 25 as shown in FIG. 2*a* to 2*c*). A second protective film may be formed on the first protective film (see, 26 as show in FIG 8*a* to 8*c*). Further, an embedded film 15, a p-electrode 16, an third protective film 17, p-side pad electrode 18, an n-electrode 19, and so forth are formed.

As shown in the cross section of the active layer of FIG. 2*a*, the front view of FIG. 2*b*, and the vertical cross section of FIG. 2*c*, the first protective film 25 is formed in contact with at least the active layer of the cavity end face, and is formed thinner than the maximum thickness of the first protective film in the region in contact with the active layer 12 (optionally, the nearby region of the active layer) (see 25*a* in FIG. 2*a*; hereinafter, the region where this thin film is formed will also be referred to as the "thin film region").

Here, the thin film region 25*a* is a region of the cavity end face in the nitride semiconductor layer that is called an optical waveguide region, and includes at least the active layer 12. When an SCH (Separate Confinement Heterostructure) is employed, it is a region that may include the active layer 12 and all or part of guide layers located above and below the active layer 12. An optical waveguide region is also referred to as a core region.

Also, the thin film region 25*a* includes the region below a ridge 14, and usually a region below the ridge 14 and the nearby region (e.g., a region in the vicinity of the ridge), that is, the region corresponding to NFP (Near Field Pattern), or the region below the ridge and the region extending to the left and right of the ridge, the thin film region of the whole width is suitably about 1.5 times of the ridge width or less. The width W (see FIG. 2*b*) of this thin film region 25*a* is, for example, about 0.5 to 3.0 μm, and preferably about 1.0 to 2.0 μm. Its height H (see FIG. 2*c*) may be from about the same as that of the active layer to about 4000 Å, preferably about the same as that of the active layer to about 2000 Å, and preferably about the same as that of the active layer to about 1000 Å.

Further, the planar shape of the thin film region 25*a* at the cavity end face is usually elliptical or circular, but depending on the material of the first protective film, the method for forming the first protective film, the method for making the first protective film into a thin film, and so on, the shape may be square or a rounded square. A horizontally elliptical shape is particularly favorable. Forming the thin film region to correspond to the shape of the optical waveguide region is more efficient, allows heat dissipation to improve and the COD level to be kept high.

As to how thin the thin film region 25*a* is, it may be thinner than the maximum thickness. For example, it is good for the thickness of the thin film region to be thin, but at least about 5%, preferably at least about 10%, and at least about 40% of the maximum thickness. For instance, it is good if the thickness of the thin film region (D4 in FIG. 8*a*) is at least about 5%, and preferably at least about 10%, of the maximum thickness (D3 in FIG. 8*a*). From another standpoint, it is good for the thin film region 25*a* to be formed in a thickness of at least about 10 Å. Also, the thickness of the thin film region 25*a* may be at least 40% of the maximum thickness. The thin film region 25*a* preferably has a thickness of at least about 20 Å, and more preferably at least about 30 Å. If the thin film region has about this much thickness, then even though it is thinner than the other region, there will be less degradation and so forth due to inadequate strength, and the first protective film with a stable can be obtained.

Because of possible measurement error, variance, etc., it is good if the thickness of each region is measured and/or determined after taking into account Ten-Point Height of roughness Profile, Arithmetic Mean Deviation of the Profile (see JIS B 0601(1994) or JIS B 0031(1994), or the like of each region. However, if the thin film region becomes a thin film in gradient fashion as will be discussed below, the thickness of the thinnest region and the thickness of the region of maximum thickness preferably have the relationship as discussed above. Thus making the first protective film a thin film reduces stress with the nitride semiconductor layer in this region and prevents cracking in the nitride semiconductor layer and the first protective film.

The thickness of the first protective film does not necessarily have to be uniform in the thin film region. For example, the thin film region may be formed in gradient fashion in the form of a bowl or dome, or just the region corresponding to the NFP or the optical waveguide region may be recessed in steps, or the first protective film surface of the thin film region may be formed irregularly.

The first protective film covers the cavity end face formed on the nitride semiconductor layer, but does not necessarily have to cover the entire cavity end face, and may cover at least the optical waveguide region of the cavity end face. Also, as will be discussed below, the first protective film may partially cover a face other than the cavity end face (the same applies to the second film and second protective film discussed below). The first protective film may be a film composed of oxides (Si, Mg, Al, Hf, Nb, Zr, Sc, Ta, Ga, Zn, Y, B, Ti, etc.), nitrides (AlN, AlGaN, GaN, BN, etc.) or fluorides and the like.

Examples of the crystal structure of the first protective film include hexagonal system, cubic system, and rhombic system. The lattice constant is preferably close to that of the nitride semiconductor (e.g., the difference from the lattice constant of the nitride semiconductor is no more than 15%) because a first protective film with good crystallinity can be formed. A film made from a material having a hexagonal system crystal structure is especially favorable, and a nitride is better yet. From another standpoint, the film is preferably formed from a material with no absorption with respect to the oscillation wavelength of the laser element.

There is no particular restriction on the thickness in the region where the maximum thickness of the first protective film is formed, for example, about 50 to about 1000 Å, and preferable about 50 to about 500 Å.

Examples of the cavity end face of the nitride semiconductor layer include orientation along the M-axis, the A-axis, the C-axis, and the R-axis. That is, it is a plane selected from the group consisting of the M-plane (1-100), the A-plane (11-20), the C-plane (0001), and the R-plane (1-102), with M axial orientation being particularly favorable. The "cavity end face" usually means a region including the above-mentioned region corresponding to the NFP or the optical waveguide region, but the region having this specific orientation may be at least a region other than the region corresponding to the NFP or the optical waveguide region. Also, not just this region, but the region corresponding to the NFP or the optical waveguide region may also have the above-mentioned orientation. The first protective film (mainly the first protective film in the region other than the optical waveguide region) is preferably a film including a region oriented coaxially with the end face (cavity end face) having this orientation, and oriented along the M-axis <1-100>, A-axis <11-20>, C-axis <0001>, or R-axis <1-102>.

This improves the quality of the first protective film, maintains or augments the region of the thin film even when the semiconductor laser element is being driven, while allowing stress to be reduced so as to prevent cracking in the nitride semiconductor layer and a protective film, and allows the COD level to be reliably raised. It is especially favorable for the first protective film (mainly the first protective film in the region other than the optical waveguide region) to include M-axis orientation region.

The "M-axis orientation" referred to here may be not only a state in which monocrystalline is oriented strictly along the M-axis, but also a polycrystalline state, a state in which polycrystalline are present, but sites of orientation along the M-axis are uniformly included, or a state in which they are included in a uniform distribution. In the case of a polycrystalline state, the difference from the lattice constant of the cavity end face does not appear as distinctly, and this difference is diminished.

Also, with the film in which the first protective film is formed as a film with M-axis orientation, treatment for obtaining the desired thin film can be easily adjusted by controlling the duration, as discussed below. Even when the semiconductor laser element is being driven, stress in the nitride semiconductor layer can be reduced in the region of the thinner film.

As mentioned above, the COD level can be raised by using a first protective film oriented coaxially with the cavity end face, but with a nitride semiconductor laser element it is usually difficult to form a first protective film that oriented coaxially with the cavity end face and has good crystallinity. Also, even if a first protective film with good crystallinity is formed, the first protective film will be susceptible to cracking because of the difference between the lattice constants of the first protective film and the nitride semiconductor layer. Further, if the first protective film is thin enough that cracks do not develop, heat cannot be sufficiently dissipated in a nitride semiconductor laser with high optical density.

However, heat dissipation can be increased and the COD level is leaving high by forming a thin film region corresponding to the optical waveguide region as with the present invention. When the first protective film is coaxially oriented in the thin film region, an effect caused by a window structure is obtained. Also, since the film is thin, cracking of the first protective film can be suppressed even with a film with good crystallinity and having a specific crystal orientation. Furthermore, heat generated by element drive can be favorably dissipated from the region other than the thin film region. Since no light is outputted from this region, heat can be suppressed and cracks can be reduced compared with the thin film region, even if a certain amount of cracking should occur, it will have less effect on element characteristics, and as a result, a nitride semiconductor laser element of higher output can be obtained.

The first protective film can be formed, for example, by a method that is known in this field. For instance, this can be vapor deposition, sputtering, reactive sputtering, ECR (electron cyclotron resonance) plasma sputtering, magnetron sputtering, ion beam assist deposition, ion plating, laser ablation, CVD (Chemical Vapor Deposition), spraying, spin coating, dipping, a combination of these two or more methods, a combination of these methods and oxidation (thermal treatment), or any of various other methods. If the combination is adopted, it may be unnecessarily to form and/or treat simultaneously or continuously, it may firstly form the film followed by treating it, and vice versa. Among these, it is preferably ECR plasma sputtering, and a combination of ECR plasma sputtering followed by thermal treatment.

In particular, to obtain the first film that has the same axial orientation as the end face of the cavity, although it will depend on the film formation method, it is preferable to control film formation by subjecting the end face of the cavity to a nitrogen plasma treatment prior to film formation, or to adjust the film formation rate to a relatively slow rate, or to control the atmosphere during film formation (to a nitrogen atmosphere, for example), or to adjust the film formation pressure to a relatively low level, etc. Two or more of these methods may also be combined.

Also, the nitrogen partial pressure may be gradually or abruptly changed during the film formation in each method, or the film formation pressure may be gradually or abruptly changed.

In forming the first film by sputtering, examples of methods include a method in which a first film material is used as a target and the film formation rate is gradually or abruptly increased, or the RF power is gradually or abruptly increased (with the range of increase being about 50 to 500 W), or the distance between the target and substrate is gradually or abruptly changed (with the range of change being about 0.2 to 3 times the original distance), and a method in which the pressure is gradually or abruptly lowered (with the range of reduction being about 0.1 to 2.0 Pa) in the formation of the first film using a first film material as a target.

More specifically, when the film formation rate is adjusted, the first film is preferably formed at a rate of 5 to 100 Å/min, and then at a rate that is at least as high. Also, when RF power is adjusted, the first film is preferably formed at a power of 100 to 600 W, and then at a power that is at least as high.

After that, the first film may be subjected to a oxidation or light exposure treatment.

With another method, the temperature of the substrate is gradually or abruptly raised or lowered (with the range of change being about 50 to 500° C.). There are no particular restrictions on the method for forming the thin film region of the first protective film, but an example is to first form a first protective film of the required thickness over the entire surface of the cavity end face, then produce a partial thin film region in the film thickness direction of the first protective film by employing a known photolithography method (such as applying a resist, pre-baking, exposing, developing and post-baking etc.) and etching (such as wet etching with an alkali developer, or dry etching with a chlorine-based gas), or by subjecting the thin film region locally to light exposure, oxidation, or the like. When the first protective film is made into a thin film by light exposure or the like, this is preferably performed after a second protective film (discussed below) has been formed over the first protective film, in order to prevent the oxidation of the first protective film. Here, the first protective film in the optical waveguide region may be locally exposed to laser light by driving the element, or a thin film region may be formed by exposure to light from the outside.

Known photolithography and etching processes may be utilized to form a first protective film in the desired thickness in just the other region of the cavity end face, and then a first protective film of the same material may be laminated over the entire surface of the cavity end face to form the thin film region. Also, before the first protective film is formed on the cavity end face, a pretreatment or the like may be performed locally so that the quality, thickness, etc., of the resulting first protective film can be locally varied. Furthermore, these methods can be combined as desired. When light exposure, oxidation, pretreatment, or the like is performed, they are preferably performed at a temperature that will not adversely affect the nitride semiconductor layer, particularly that constituting the active layer or the nearby area, in order to prevent local degradation, modification, etc., of the cavity end face. For example, the temperature is preferably about 900° C. or lower.

In the nitride semiconductor laser of the present invention, it is preferably formed the second protective film (see 26 as shown in FIG. 6b, 6c, 8a or 8c) having different quality, material or composition with the first protective film on the first protective film. The second protective film can make the first protective film to be more forcibly adhered into the cavity end face. The second protective film may be a film composed of oxides of Si, Mg, Al, Hf, Nb, Zr, Sc, Ta, Ga, Zn, Y, B, Ti, etc., preferably be a film composed of $SiO_2$. The second protective film may be has any of single layer or laminated structure. The second protective film is formed from a single layer of Si oxide or Al oxide, or a laminated structure of Si oxide and Al oxide.

When the second protective film is a partially thick film, the first protective film is more forcibly pushed into this region, affording better adhesion, and preventing the material of the second protective film from working its way into areas where it is not intended to be, namely, the electrode or substrate portion, which means that heat can be dissipated more efficiently from this portion, and it is possible to prevent a decrease in heat dissipation. As a result, stable operation can be ensured, and the COD level can be raised.

There are no particular restrictions on the thickness of the second protective film, but it is favorable for it to be thick enough to function as a protective film. For example, the combined thickness of the first protective film and second protective film is preferably about 2 μm or less.

As shown in FIGS. 7 and 8a to 8c, the second protective film has a thick film part (see 26a in FIGS. 7 and 8a) that protrudes from at least a location corresponding to the region opposite the active layer 12 (and optionally the nearby region), or in other words, the near the optical waveguide region of the cavity end face, that is, the thin film region of the first protective film, and from the face on the opposite side. This thick film part is thicker than the film in the region other than the active layer 12 (and optionally the nearby region) (hereinafter sometimes referred to simply as "the other region") of the second protective film. The range of the thick film part of the second protective film in the horizontal direction (the width direction of the nitride semiconductor layer) can be defined, as discussed above, for example, as the region below and nearby a ridge, that is, a region having a width equal to or greater than the width of the ridge and equivalent to the ridge width, and the surrounding region, so that this region is completely covered.

The width W2 (see FIG. 8a) of the thick film part 26a on the opposite side from the active layer is about 0.5 to 3.0 μm, for example, and preferably 1.0 to 2.0 μm. The height H2 (see FIG. 8c) is from about the same as that of the active layer 12 to about 4000 Å, for example, and from about the same as that of the active layer 12 to about 2000 Å, and preferably from about the same as that of the active layer 12 to about 1000 Å.

The thick film part 26a is favorably a region on the opposite side with the active layer side, in which the total width is about 1.7 times the ridge width or less. The width W1 (see FIG. 8b) of the thick film part 26a is about 0.55 to 10 μm, for example, and preferably 1.05 to 5.0 μm. The height H1 (see FIG. 8c) is from about the same as that of the active layer 12 to about 9000 Å, for example, and from about the same as that of the active layer 12 to about 7000 Å, and preferably from about the same as that of the active layer 12, about 600 Å, to about 5000 Å.

Figure 8A:
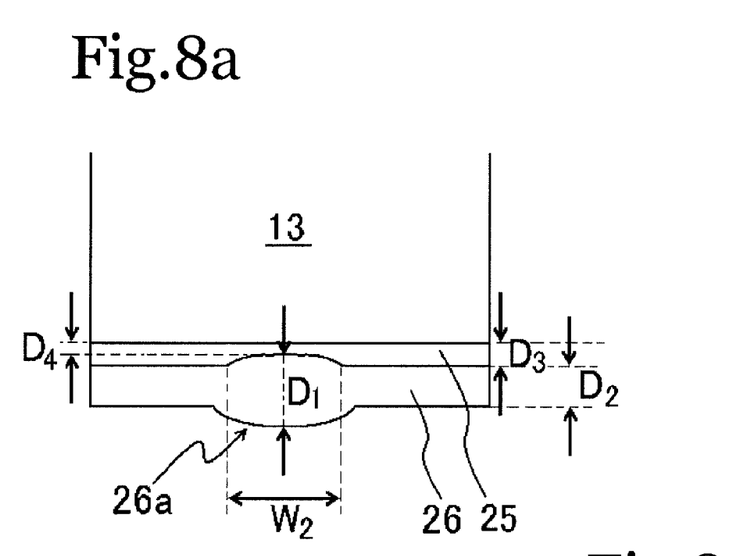
FIGS. 8*a* to 8*c* are simplified diagrams around the active layer illustrating the structure of the another protective film of the present invention.
Figure 8B:
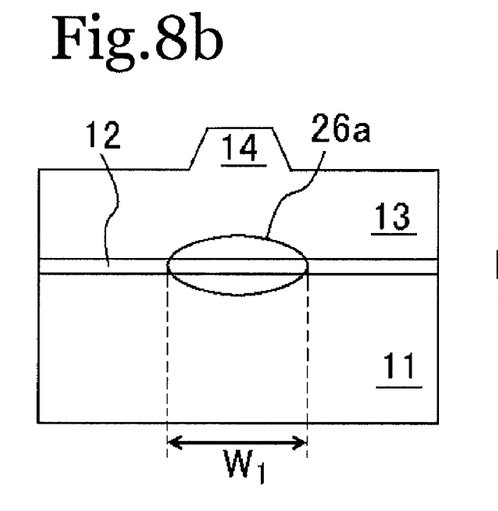
Figure 8C:
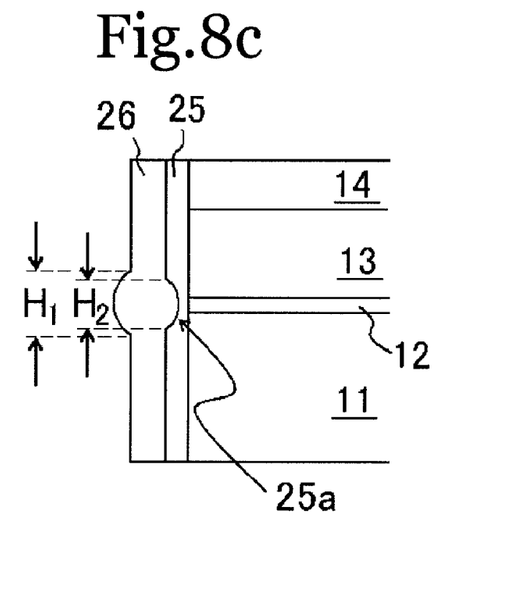

Thus, the surface area of the thick film part 26a of the second protective film formed on the cavity end face side is preferably smaller than the surface area of the thick film part 26a formed on the opposite side (uppermost surface). Also, the shape of the thick film part 26a on the cavity end face side is substantially the same as that of the thin film region of the first protective film, and the (protruding) shape of the thick film part 26a on the opposite side is preferably similar as that of the cavity end face side.

The thick film part 26a may be any thickness as long as it is thicker than the other region. For example, the thickness of the thick film part (D1 in FIG. 8a) is favorably at least about 2%, and preferably at least about 5%, greater than the thickness of the other region (D2 in FIG. 8A). From another standpoint, the thick film part 26a is preferably formed at least about 100 Å greater than the thickness of the other region. There are no particular restrictions on the thickness D2 of the second protective film, but it is favorable for it to be thick enough to function as a protective film. For example, the combined thickness of the first protective film and second protective film is preferably about 2 μm or less, the thickness D2 about 1000 to 4000 Å, and the thickness D1 about 50 to 1000 Å. The amount of protrusion on the active layer side and the amount of protrusion on the opposite side may be the same or different.

Just as with the thin film region discussed above, the thick film part is favorably measured/determined after taking into account the ten-point average roughness, etc., and may be formed as a gradient, in steps, or in an irregular form.

The second protective film also can be formed, for example, by a method that is known in this field just like the above described the first film. In particular, the second film is preferably formed as an amorphous film, to this end, although it will depend on the film formation method, it is preferable to adjust the film formation rate to a relatively fast rate, or to control the atmosphere during film formation (to a oxygen atmosphere, for example), or to adjust the film formation pressure to a relatively high level, etc. Two or more of these methods may also be combined. In the method of controlling the oxygen atmosphere, it is preferably introduced oxygen to the extent that the second protective film does not have absorption. For instance, the second protection film may be formed with a sputtering apparatus by using Si target, at an oxygen flow of about 3 to 20 sccm, an RF power of about 300 to 800 W.

Also, the first protective film and second protective film may be formed not only on the emitting side of the cavity end face, but also on the reflecting side, and the materials, film thickness, etc., may differ between the two. Examples of the second protective film on the reflecting side include a laminated structure of a silicon oxide and a zirconium oxide, a laminated structure of an aluminum oxide and a zirconium oxide, a laminated structure of a silicon oxide and a titanium oxide, a laminated structure of an aluminum oxide, a silicon oxide, and a zirconium oxide, and a laminated structure of a silicon oxide, a tantalum oxide, and an aluminum oxide, etc. The lamination period and so forth can be suitably adjusted according to the desired reflectivity.

Figure 6A:
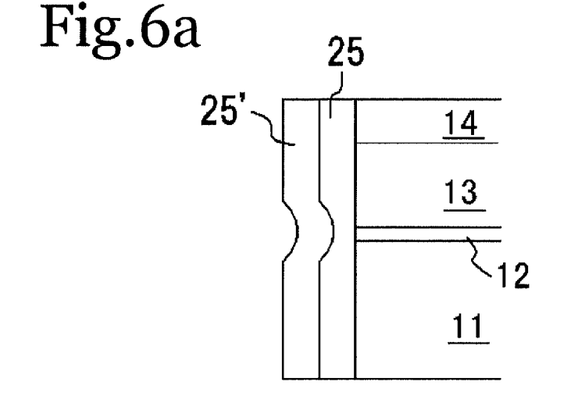
FIGS. 6a-6c are simplified cross sectional views illustrating examples of the structure of protective film of the present invention.
Figure 6B:
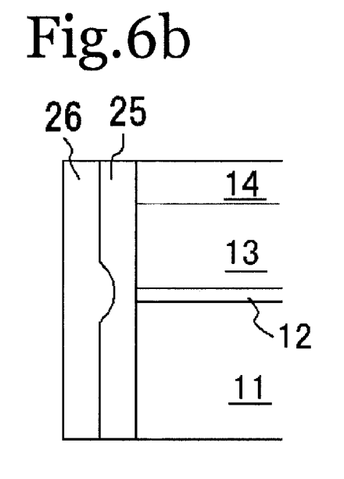
Figure 6C:
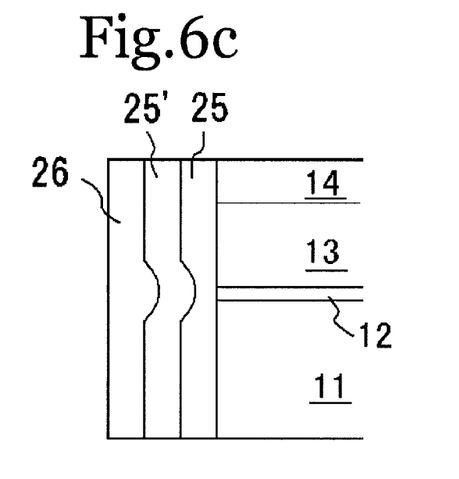
Figure 7:
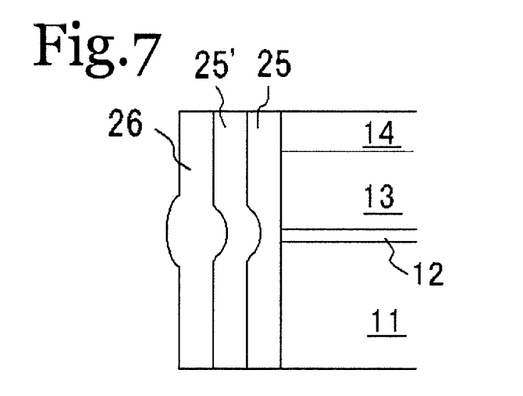
FIG. 7 is simplified cross section illustrating the structure of another protective film of the present invention.

A second film may optionally be formed between the first protective film and the second protective film (see 25' in FIGS. 6a and 6c and FIG. 7). The second film is preferably formed from a material having the same crystal structure as the first protective film (hereinafter sometimes referred to as the first film), such as a material with a hexagonal crystal system. The material and crystal orientation of the second film can be the same as those of the first film. For example, the first film and second film can have crystal structures with the same material and different axial orientations, different materials and the same axial orientation, different materials and different axial orientations, or the same material and the same axial orientation. It is especially favorable to use crystal structures with different materials and the same axial orientation. For example, the crystal structures can have the same axial orientation (more specifically, with both having M-axis orientation), with the first film formed from AlN and the second film from GaN. This produces a protective film with good crystallinity, and reduces separation between the protective films. Also, there may be a thin film region the same as that of the above-mentioned first protective film (first film). Preferably, the shape is such that the thickness is the same throughout, that is, the area around the optical waveguide region (core region) is sunken, corresponding to the thin film region of the first protective film formed previously. A shape such as this can be obtained by making the film thickness about the same as that of the first film.

The second film can be formed in the same manner as the above-mentioned first protective film.

Thus, with the semiconductor laser element of the present invention, it is preferable for the first protective film to be a nitride film and to be oriented coaxially with the cavity end face in order to further raise the COD level. However, if the thickness of the first protective film is increased, the difference in lattice constants between the first protective film and the nitride semiconductor layer will introduce a new problem in that the first protective film will be more prone to cracking. In view of this, it is preferable to keep the film thickness low enough that no cracks will develop in the first protective film, and to form the second protective film as an amorphous film. Doing this further relieves stress at the interface between the first protective film and the nitride semiconductor layer, while further increasing adhesion of the first protective film, and furthermore, if the second protective film is formed as a thick film only where required, then formation of the second protective film in unnecessary locations will be prevented and heat dissipation and so forth will be further enhanced.

In the present invention, the substrate for forming the nitride semiconductor laser may be an insulating substrate or a conductive substrate. The substrate is, for example, preferably a nitride semiconductor substrate having an off angle of no more than 10° and greater than 0° to the first main face and/or the second main face. The thickness of the substrate is at least 50 μm and no more than 10 mm, for example. A commercially available substrate, any of the various known substrates disclosed, for instance, in Japanese Laid-Open Patent Application 2006-24703, or the like may be used.

The nitride semiconductor substrate can be formed by a vapor phase growth method such as MOCVD (Metal Organic Chemical Vapor Deposition), HVPE (Hydride Vapor Phase Epitaxy), MBE (Molecular Beam Epitaxy), or the like, a hydrothermal synthesis method in which crystals are grown in a supercritical fluid, a high pressure method, a flux method, a melt method, or the like.

The nitride semiconductor layer may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The n-side nitride semiconductor layer may doped with at least one n-type impurity of IV or VI group elements, such as Si, Ge, Sn, S, O, Ti, Zr, Cd etc. The p-side nitride semiconductor layer may doped with at least one p-type impurity, such as Mg, Zn, Be, Mn, Ca, Sr etc. The doped concentration is, for example, about $5 \times 10^{16}/cm^3$ to about $1 \times 10^{21}/cm^3$. All of layers in the n-type or p-type nitride semiconductor layers may not necessarily contain n-type or p-type impurity.

The active layer may be a multiple quantum well or single quantum well structure, especially, the active layer may have a general formula of $In_xAl_yGa_{1-x-y}N$ ($0 \leq x \leq 1$, $0 \leq y \leq 1$, $0 \leq x+y \leq 1$).

Also, the active layer preferably has narrower bandgap energy than the protective film. With the present invention, setting the bandgap energy of the protective film wider than that of the active layer widens the bandgap energy of the cavity end face, or to put it another way, widens the impurity level near the cavity end face, and forms a window structure, and this in turn improves COD level.

In the nitride semiconductor laser element of the present invention may emits laser light with a wavelength of about 220 to 500 nm, it is possible to prevent separation of the protective film and to improve COD level.

The nitride semiconductor layer preferably has a structure which is a SCH wherein an optical waveguide is constituted by providing n-side and p-side optical guide layers above and below the active layer. However, there is no particular restriction on these structures.

There is no particular restriction on a growth method of the nitride semiconductor layer, it can be formed by means of any known method which can grow these nitride semiconductor layers, such as MOVPE (Metal-Organic Vapor Phase Epitaxy), MOCVD, HVPE, MBE or the like. In particular, MOCVD is preferable because it allows the nitride semiconductor to be growth with good crystallinity.

A ridge is formed on the surface of the p-side nitride semiconductor layer. The ridge functions as an optical waveguide, the width of the ridge may be from 1.0 to 30.0 μm and, if the nitride semiconductor laser is used a light source of a transverse single mode, preferably from 1.0 to 3.0 μm. The height of the ridge (the etching depth) may be, for example, may be from 0.1 to 2 μm. The extent of optical confinement can be suitably adjusted by adjusting the thickness, material, and so on of the layer that makes up the p-side semiconductor layer. The ridge is preferably set so as to be 200 to 5000 μm of cavity length. The ridge need not be all the same width in the extension direction of the cavity, and its side faces may be vertical or may be tapered with an angle of about 45 to 90°.

An embedded film is usually formed on the surface of the nitride semiconductor layer and to the side faces of the ridge. That is, the embedded film is above the nitride semiconductor layer, is in direct contact with the nitride semiconductor layer and an electrode (discussed below), and is formed in a region other than the region where an electrical connection is made. There are no particular restrictions on the position, size, shape, etc., of the region of connection between the nitride semiconductor layer and the electrode, but this region may, for example, be part of the surface of the nitride semiconductor layer, such as substantially the entire top face of the stripe-like ridge formed on the surface of the nitride semiconductor layer.

The embedded film is generally formed from an insulating material with a smaller refractive index than that of the nitride semiconductor layer. The refractive index can be measured using a polarizing ellipsometer (featuring ellipsometry), more specifically, it is, for example, HS-190 made by J. A. WOOLLAM and other ellipsometers. This embedded film is an insulator of a dielectric film of single layer or multilayer film composed of oxides, nitrides or oxide-nitrides of Zr, Si, V, Nb, Hf, Ta, Al, Ce, In, Sb, Zn and the like. The embedded film may have monocrystalline, polycrystalline or amorphous structure. If the embedded film is formed from the side faces of the ridge all the way to the surface of the nitride semiconductor on both sides of the ridge, it will ensure a refractive index difference versus the nitride semiconductor layer, and particularly the p-side semiconductor layer, which allows leakage of light from the active layer to be controlled, allows light to be confined efficiently within the ridge, and also better ensures insulation near the base of the ridge, so the generation of leak current can be avoided.

This embedded film can be formed by any method that is known in this field. For instance, a variety of methods can be used, such as vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and oxidation (thermal treatment), or the like.

A p-side electrode is preferably formed over the nitride semiconductor layer and the embedded film. Separation of the embedded film can be prevented by forming the electrode continuously over the embedded film and the nitride semiconductor layer that is the outermost layer. In particular, separation of the embedded film formed on the ridge side faces can be effectively prevented by forming the p-side electrode up to the ridge side faces.

The p-side and an n-side electrodes may preferably be formed with a single layer or laminated layer of a metal or metal alloy of palladium, platinum, nickel, gold, titanium, tungsten, cupper, silver, zinc, tin, indium, aluminum, iridium, rhodium, ITO (Indium Tin Oxide) or the like. The p-side electrodes are suitable formed in a thickness of, for example, about 500 to about 5000 Å depend on the material used. The electrodes may be formed at least on the first and second semiconductor layer or the substrate, respectively, and further may be formed pad electrodes thereon with a conductive layer of a single layer or laminated layer.

Figure 3:
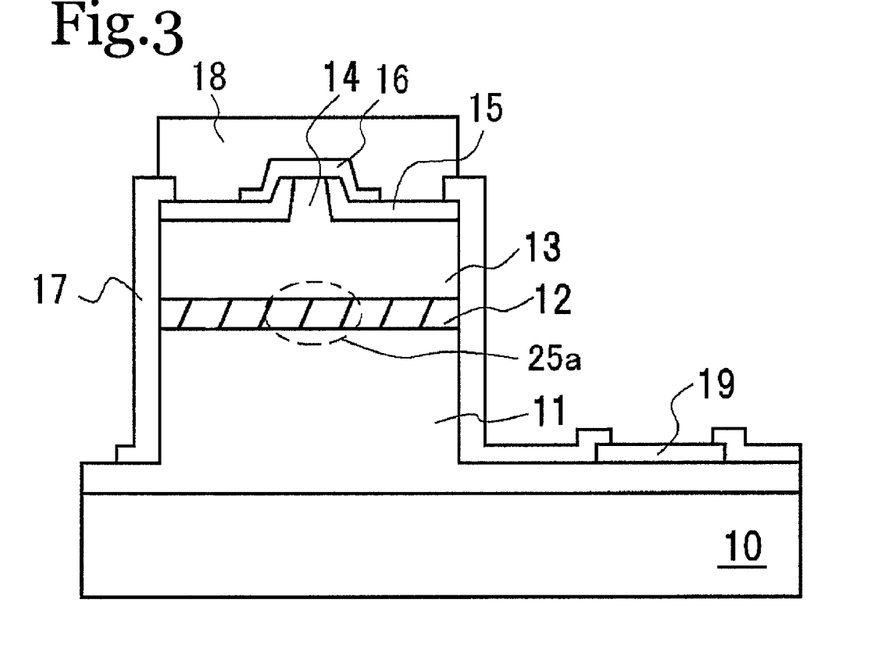
FIG. 3 is simplified cross section illustrating the structure of another protective film of the present invention.

The p-side and n-side electrodes may be formed on the same side with respect to the substrate, as shown in FIG. 3.

A third protective film is preferably formed on the embedded film. This third protective film may be disposed over the embedded film on at least the surface of the nitride semiconductor layer, and preferably also covers the side faces of the nitride semiconductor layer and/or the side faces, surface, etc., of the substrate with or without the embedded film interposed therebetween. The third protective film can be formed from the same materials as those listed as examples for the embedded film. As a result, it is possible to ensure not only insulation reliably but also protection for the exposed side faces, surface, etc., of nitride semiconductor layer.

The embedded film is preferably formed from the side faces of the nitride semiconductor layer up to the top face, a p-side pad electrode is preferably formed on the top faces of the p-side electrode and the third protective film.

The protective film (the first film, the second film and the second protective film) are formed continuously over the cavity end face and the surface of the second nitride semiconductor layer. The protective film formed on the surface of the nitride semiconductor layer may keep distance from, contact with or cover the p-side electrode, the embedded film and the p-side pad electrode. In particular, the protective film formed on the surface of the nitride semiconductor layer preferably covers the p-side electrode and the embedded film. Thus, separation of the embedded film and the p-side electrode can be effectively prevented.

The thickness of the end face protective film formed on the second nitride semiconductor layer surface is preferably less than the thickness of the end face protective film formed on the cavity end face. If the protective film on the semiconductor layer surface is formed in about the same thickness as the protective film on the cavity end face, or thicker, cracks may develop in the protective film, so the purpose is to prevent this from happening.

The protective film formed on the second nitride semiconductor layer surface is preferably oriented coaxially with the crystal plane of the nitride semiconductor layer, and C-axis orientation is particularly favorable. This affords good adhesion between the protective film and the semiconductor layer surface.

When the protective film is formed from the cavity end face way to the semiconductor layer surface, it is preferably formed so that the corners have a different crystal plane from that of the cavity end face and the semiconductor layer surface. This reduces the local stress that is applied at the corners, where protective film separation is most likely to occur, and relieves stress between the cavity end face and the protective film, thereby preventing the protective film from separating. The protective film may also be formed extending from the cavity end face to the back of the substrate (the opposite side from the side where the nitride semiconductor layer is formed). Here again, just as above, the crystal planes may be different between the cavity end face and the back of the substrate.

Also, a nitride semiconductor laser device is obtained, for example, by mounting a nitride semiconductor laser element to a submount, a stem, or another such support member, and joining a cap member to the support member. Examples of the atmosphere in which the cap member is joined and sealed include a nitrogen atmosphere, an air atmosphere, and an atmosphere containing a rare gas element or oxygen (with a proportional content of 0 to 20%). There are no particular restrictions on the sealing atmosphere when the thin film region is formed after cap sealing, either.

Examples of the nitride semiconductor laser element of the present invention will now be described in detail through reference to the drawings.

EXAMPLE 1

As shown in FIGS. 1 and 2a to 2c, the nitride semiconductor laser element of this Example comprises the first nitride semiconductor layer (n-side, for example) 11, the active layer 12, and the second nitride semiconductor layer (p-side, for example) 13 (on the surface of which is formed the ridge 14), laminated in that order on the substrate 10, and a cavity is formed.

With this nitride semiconductor laser element, a first protective film (see 25 as shown in FIG. 2c) is formed on the end face of the cavity, and also an embedded film 15, a p-side electrode 16, an n-side electrode 19, a third protective film 17, p-side pad electrode 18 and the like are formed.

A cavity end face is formed from mainly a nitride semiconductor layer having M-axis orientation, and as shown in FIG. 2, the first protective film 25 is provided to at least one cavity end face, and is oriented coaxially with that cavity end face, that is, in M-axis orientation, over which a second protective film 26 (see FIG. 6b) is formed. The first protective film 25 is composed of AlN and is about 100 Å thick. The second protective film 26 is composed of $SiO_2$ and is about 2500 Å thick. The first protective film 25 has a thin film region 25a on the region extending to the first nitride semiconductor layer 11, the active layer 12 and the second nitride semiconductor layer 13 in the lamination direction of semiconductor layer, also on the region extending below and to the left and right of a ridge 14 in the width direction of the laser element. This thin film region 25a, for example, is such that the thickness D11 of the thin film region of the first protective film 25 is about 70 Å, and the maximum thickness D12 is about 100 Å, that is, there is a depression of about 30 Å in the thin film region. The width W of the thin film region 25a is about 2.0 μm and the height H is about 500 Å.

This nitride semiconductor laser element can be manufactured by the following method.

First, a GaN substrate is prepared. On the GaN substrate, a layer composed of $Al_{0.03}Ga_{0.97}N$ doped with Si at $4 \times 10^{18}/cm^3$ (2 μm thick) is grown at a growth temperature of 1160° C. using trimethyl aluminum (TMA), trimethyl gallium (TMG) and ammonia ($NH_3$) as the raw material gas with a silane gas for an impurity gas. This n-side clad layer may be composed of a multilayer film (superlattice structure).

Next, the silane gas is stopped, and n-side wave guide layer composed of undoped GaN (0.175 μm thick) is grown at a growth temperature of 1000° C. This wave guide layer may be doped with n-type impurities.

The temperature is set to 900° C., a barrier layer composed of $In_{0.02}G_{0.98}N$ doped with Si (140 Å thick) and at same temperature, a well layer composed of undoped $In_{0.07}Ga_{0.93}N$ (70 Å thick) are laminated on the barrier layer. This process is repeated 2 times, finally the barrier layer is formed on the layers to grow an active layer composed of a multi quantum well (MQW) structure with a total thickness of 560 Å.

A p-side cap layer composed of $p-Al_{0.25}Ga_{0.75}N$ doped with Mg at $1 \times 10^{20}/cm^3$ (100 Å thick) is grown on the active layer using TMG, TMA, $NH_3$, and $Cp_2Mg$ (bis-cyclopentadienyl magnesium) at a growth temperature of 1000° C. This p-side cap layer can be omitted.

Next, $Cp_2Mg$ gas and TMA are stopped, and p-side wave guide layer composed of undoped GaN (0.145 μm thick) is grown at a growth temperature of 1000° C., which has a bandgap energy narrower than the p-side cap layer.

The temperature is set to 1000° C., and a layer composed of undoped $Al_{0.10}Ga_{0.90}N$ (25 Å thick) is grown, then $Cp_2Mg$ gas and TMA are stopped, and a layer composed of undoped GaN (25 Å thick) is laminated. These layers are alternately laminated, and this process is repeated to grow a p-side clad layer composed of a super lattice structure with a total thickness of 0.45 μm.

Finally, a p-side contact layer composed of GaN doped with Mg at $1 \times 10^{20}/cm^3$ (150 Å thick) is grown on the p-side clad layer at a growth temperature of 1000° C.

The resulting wafer on which the nitride semiconductor has been grown is taken out of a reaction vessel, and a mask layer composed of $SiO_2$ is formed on the surface of the p-side contact layer (the outermost layer) as a stripe with a length in a direction of the cavity of 800 μm. This portion will be main body of the cavity in the laser element. The cavity length may be preferably set to the range from 200 to 5000 μm.

Next, a $SiO_2$ protective mask is formed as a stripe-shaped mask on the surface of the p-side contact layer, and RIE etching is performed using $SiCl_4$ gas. By these means, a stripe ridge waveguide region is formed.

Then, the sides of the ridge are protected by an insulating layer (i.e., an embedded film) composed of $ZrO_2$.

Next, a p-electrode composed of Ni (100 Å)/Au (1000 Å)/Pt (1000 Å) is formed on the surface overlying the p-side contact layer and the insulating layer. Subsequently, a third protective film composed of silicon oxide ($SiO_2$: 0.5 μm thick) is formed by sputtering on the embedded film, and on the sides of the semiconductor layer. After that, ohmic annealing is performed at 600° C.

Next, Ni (80 Å)/Pd (2000 Å)/Au (8000 Å) are formed continuously in this order on the exposed p-electrode that is not covered by the third protective film, to produce a p-side pad electrode.

And then, the surface of the substrate which is opposite to the side growing the nitride semiconductor layers is polished so as to have a thickness of 80 μm.

An n-electrode composed of Ti (150 Å)/Pt (2000 Å)/Au (3000 Å) is formed on the polished surface of the substrate.

Next, recessed grooves are formed on the side of the semiconductor layer of the substrate in a wafer state having the n-electrode, the p-electrode and the p-side pad electrode. These grooves is set to depth of 10 μm, the length of 50 μm in the direction parallel to the end faces of the cavity, from the side surface of a chip, and the width of 15 μm in the cavity direction from the cavity end face. The cleaving is performed using the recessed grooves as a cleavage-assist grooves to produce bars in which the cleavage faces (1-100), which is the plane corresponding to the lateral face of a hexagonal crystal, which is to say, the M-plane) are the cavity end faces. The cavity length is set to 800 μm. And then, cutting is performed into the chip in the direction parallel to the p-electrode to produce semiconductor laser elements.

A first protective film composed of AlN is formed on the cavity end face.

Firstly, the cavity end face is treated with nitrogen plasma, an AlN film is then formed as the first protective film in a thickness of 100 Å with an ECR sputtering apparatus at a microwave power of 500 W, an RF power of 250 W, an argon flow of 30 sccm, and a nitrogen flow of 10 sccm, and at a firm formation rate of 50 Å/min.

Next, on the AlN first protective film and on the light exit face of the cavity, an $SiO_2$ film is formed as a second protective film in a thickness of 2500 Å with a sputtering apparatus using a Si target, at an RF power of 500 W, and an oxygen flow of 5 sccm.

On the light reflecting side of the cavity, an AlN film and an $SiO_2$ film may be formed in a thickness of 100 Å and 2500 Å, respectively, under the same condition as that of the film of the light exit face, further $SiO_2/ZrO_2$ films are formed in the thickness of 670 Å/440 Å with six cycle repetition.

Next, the so-called optical waveguide region of the first protective film, which is composed of AlN formed while operating voltage and/or operating current etc. is adjusted and applied to the laser element, is locally exposed to laser light. As a result, heat is generated by laser light in the optical waveguide region, and the first protective film formed over this location is reduced to a thin film.

The output of the nitride laser element thus obtained was measured after continuous oscillation at Tc (case temperature) of 80° C., Po (optical output power) of 320 mW and an oscillation wavelength of 406 nm.

For the sake of comparison, a laser element was formed by substantially the same manufacturing method as for the above-mentioned semiconductor laser element, except that the first protective film was composed of AlN and had no thin film region formed in it, instead of the first protective film (100 Å) composed of AlN and in which a thin film region was formed. The output after continuous oscillation was measured under the same conditions as above. The results are shown in FIG. 4.

Figure 4:
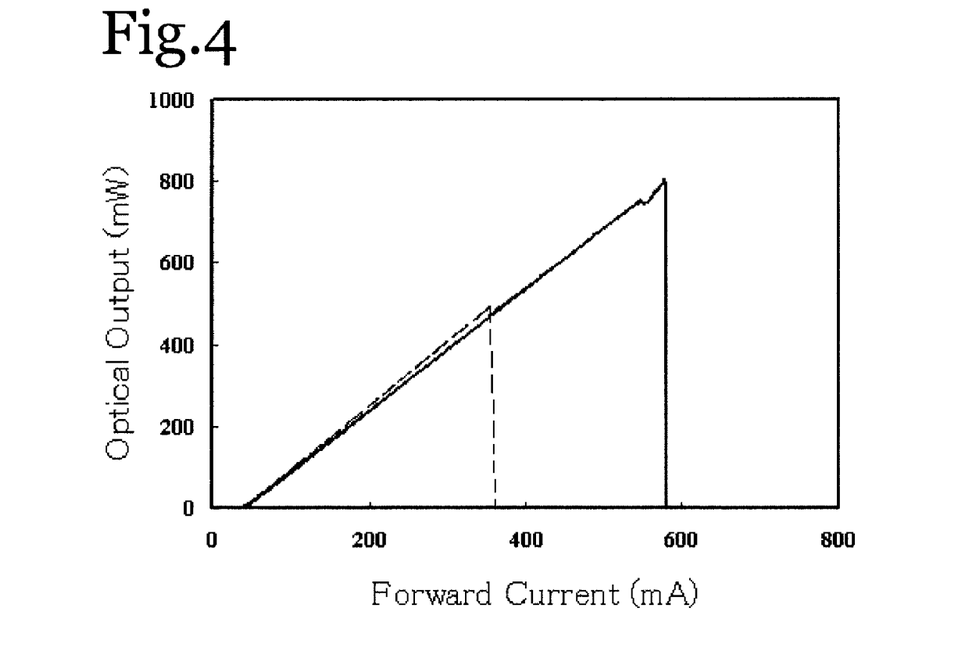
FIG. 4 is a graph showing COD level of the present invention and comparative example.

In FIG. 4, the date indicated by the solid line shows the I-L characteristics of the laser element of the present invention, which had the thin film region, and the data indicated by the dashed line shows the I-L characteristics of the laser element of the comparative example, which had no thin film region.

It can be seen in FIG. 4 that the COD level with the laser element equipped with the first protective film of the present invention and having a thin film region was markedly higher than that with the laser element equipped with a first protective film composed of AlN and having no thin film region.

For the sake of further comparison, a laser element was formed by substantially the same manufacturing method as for the above-mentioned semiconductor laser element, except that an $Al_2O_3$ film (1500 Å thick) in which no thin film region was formed at the cavity end face was formed by ECR sputtering as a film having no thin film region in this $Al_2O_3$ film, instead of the first protective film composed of AlN and the second protective film composed of $SiO_2$. The output after continuous oscillation was measured under the same conditions as above.

As a result, it was found that the decrease in the COD level is even greater than with the above-mentioned laser element equipped with the first protective film composed of AlN, and the COD level is markedly increased with the laser element equipped with the first protective film of the present invention having the thin film region, with respect to the laser element equipped with the first protective film composed of $Al_2O_3$ and having no thin film region.

Thus, the result of forming the first protective film having the thin film region on the cavity end face is that stress can be relieved in the light emitting portion of the nitride semiconductor layer constituting the cavity end face. Thus, no cracks form in the nitride semiconductor and the protective film, adhesion to the cavity end face and the end face protective film is good, separating is prevented, and this in turn increases the COD level.

To test the first protective film of the nitride semiconductor laser element thus obtained, a first film was formed by substantially the same method and from the same materials as above on an n-GaN substrate (M-axis orientation: M-plane). More specifically, a first film composed of AlN (100 Å thick) was formed over a pretreated GaN substrate using an ECR sputtering apparatus at an argon flow of 30 sccm, an nitrogen flow of 10 sccm, a microwave power of 500 W, and an RF power of 250 W. The orientation of the first film thus obtained was measured using an XRD (X-ray diffraction) apparatus (X-rays used: CuKα line (λ=0.154 nm), monochrometor: Ge (220), measurement method: ω scan, step width: 0.01°, scanning speed: 0.4 second/step). With this measurement device, the vicinity of 16 to 17° corresponded to a peak originating in AlN and indicating M-axis orientation, and the vicinity of near 18° corresponded to a peak originating in AlN and indicating C-axis orientation. The result is shown in FIG. 5.

Figure 5:
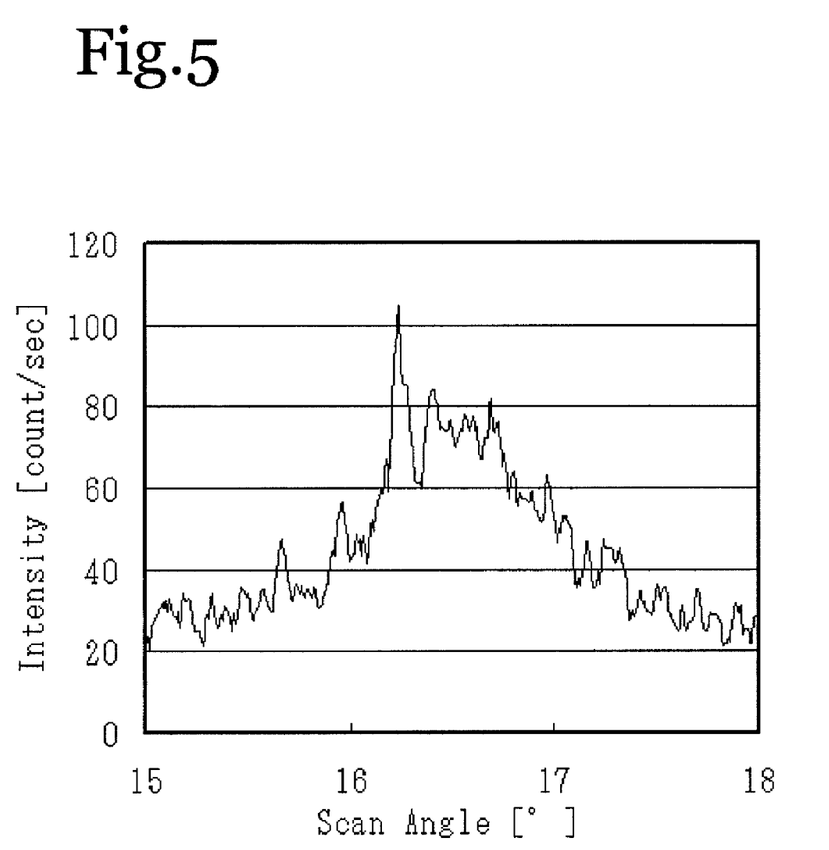
FIG. 5 is a graph showing the orientation intensity for testing of the orientation of the first protective film of the present invention.

In FIG. 5, a high peak for AlN oriented along the M-axis is seen. The vicinity of near 18° corresponded to a peak originating in AlN and indicating C-axis orientation is not almost seen. This means that the first protective film indicate M-axis orientation.

EXAMPLE 2

In this example, instead of exposing a first protective film composed of AlN to laser light, the entire surface of the AlN film over the cavity end face is coated with a resist by a known method after forming a first protective film composed of AlN, the coating is pre-baked in air for 30 minutes at 90° C., this product is exposed to light through a mask that is open only in the so-called optical waveguide region, and this product is developed and post-baked, which formed an opening in the optical waveguide region of the resist, then dry etching is performed to make a thin film from the AlN film in the optical waveguide region, the resist is removed, and then an $SiO_2$ film is formed in a thickness of 2500 Å over the first protective film having the thin film region.

The same effect as in Example 1 is also obtained in this Example.

EXAMPLE 3

This Example is the same as Example 1, except that the second protective film 26 is formed from $Al_2O_3$ (1100 Å thick).

Firstly, an AlN film is formed as the first protective film the same as that of Example 1, an $Al_2O_3$ film is then formed on the light exit face of the cavity end face in a thickness of 1100 Å using an Al target at a microwave power of 500 W, an RF power of 500 W, an oxygen flow of 5 sccm.

The same effect as in Example 1 is also obtained in this Example.

EXAMPLE 4

In Example 4, the nitride semiconductor laser element shown in FIG. 6c is formed.

More specifically, a first protective film 25 (first film) is composed of AlN and has a thickness of about 100 Å. A second film 25' is composed of $Al_2O_3$ and has a thickness of about 1100 Å. The thickness of the thin film region formed in the first protective film 25 is about 70 Å, and the maximum thickness is about 100 Å, which means that there is a depression of about 30 Å in the thin film region. The width of the thin film region is about 2.0 μm and the height is about 500 Å. A thin film region of the same size is also formed in the second film 25'. Other than this, a laser element is formed in the same manner as in Example 1.

Firstly, an AlN film is formed as the first protective film the same as that of Example 1, a GaN film is then formed as the second film 25' in a thickness of 100 Å at a microwave power of 500 W, an RF power of 500 W, an argon flow of 30 sccm and a nitrogen flow of 10 sccm, and at a firm formation rate of 100 Å/min.

Next, an $Al_2O_3$ is formed as a second protective film on the second film in a thickness of 1100 Å using an Al target at a microwave power of 500 W, an RF power of 500 W, an oxygen flow of 5 sccm.

The same effect as in Example 1 is also obtained in this Example.

EXAMPLE 5

As shown in FIG. 1 and FIGS. 8a to 8c, the nitride semiconductor laser element in this example comprised a first nitride semiconductor layer 11 (such as n-side), an active layer 12, and a second nitride semiconductor layer 13 (such as p-side) on whose surface was formed a ridge 14, which are laminated in that order over a GaN substrate 10 whose growth plane is the C-plane. A cavity was formed whose cavity end face is the M-plane.

With this nitride semiconductor laser element, the first protective film (see 25 in FIGS. 8a and 8c) and the second protective film (see 26 in FIGS. 8a and 8c) are formed on the cavity end face. Furthermore, an embedding film 15, a p-electrode 16, an n-electrode 19, a third protective film 17, a p-side pad electrode 18, and so forth are formed.

The cavity end face is mainly formed by a nitride semiconductor layer having M-axis orientation. As shown in FIG. 8a to 8c, the first protective film 25 is coaxial with the cavity end face (that is, it has M-axis orientation) in at least one cavity end face, and the second protective film 26 is formed over this.

The first protective film 25 is composed of AlN, and the thickness D3 is about 100 Å. The first protective film 25 had a thin film region 25a in the region of an active layer 12 and extending to a first nitride semiconductor layer 11 and a second nitride semiconductor layer 13, and also in the region extending below and to the left and right of a ridge 14. The thin film region 25a, for example, is such that the thickness D4 of the protective film 25 is about 50 Å, the depth of a depression is about 50 Å, the width W2 is about 2.0 μm and the height H2 is about 700 Å.

The second protective film 26 is composed of $SiO_2$, and the thickness D2 is about 3000 Å. The second protective film 26 is provided on the opposite side from the active layer, and protruded in the region extending to the first nitride semiconductor layer 11 and the second nitride semiconductor layer 13 located above and below, and also in the region below and to the left and right of the ridge 14, that is, corresponding to the thin film region 25a. A protrusion with a slightly larger surface area than that of the protrusion on the active layer side is formed on the opposite side from the active layer, and this formed a thick film part 26a. The thick film region 26a, for example, is such that the thickness D1 is about 3150 Å, the width W1 is about 3.0 μm and the height H1 is about 4000 Å. The protrusion on the active layer side is about 50 Å, while the protrusion on the opposite side is about 100 Å.

This nitride semiconductor laser element can be manufactured as follows.

A nitride semiconductor layer, a cavity are formed the same manner as Example 1 to obtain a nitride semiconductor laser element.

Next, the cavity end face is treated with nitrogen plasma, an AlN film is then formed as the first protective film in a thickness of 100 Å with an ECR sputtering apparatus at a microwave power of 500 W, an RF power of 250 W, an argon flow of 30 sccm, and a nitrogen flow of 10 sccm.

After that, an $SiO_2$ film is then formed as the second protective film in a thickness of 2900 Å with an ECR sputtering apparatus using a Si target at a microwave power of 500 W, an RF power of 500 W, an oxygen flow of 5 sccm. On the opposite side of the cavity end face, an AlN film and an $SiO_2$ film may be formed in a thickness of 100 Å and 2900 Å, respectively, under the same condition as that of the film of the light exit face, further $SiO_2/ZrO_2$ films may be formed in the thickness of 670 Å/440 Å with six cycle repetition.

And then, the so-called core region of the protective film, which is composed of AlN formed while the atmosphere, operating duration, operating voltage, operating current, and so forth are adjusted, is locally exposed to laser light. As a result, heat is generated by laser light in the core region, the first protective film formed over this location is reduced to a thin film, the second protective film protrudes to the active layer side as the first protective film is made into a thin film, and even on the opposite side from the active layer, the $SiO_2$ film is made into a thin film only at the portion exposed to laser light, and the core region of the second protective film is made into a thick film.

The output of the nitride laser element thus obtained was measured after continuous oscillation at Tc of 80° C., Po of 320 mW and an oscillation wavelength of 406 nm.

For the sake of comparison, a laser element was formed by substantially the same manufacturing method as for the above-mentioned semiconductor laser element, except that the first protective film was composed of AlN, the second protective film not protruded to the active layer side, and the second protective film, which was composed of $SiO_2$, was made into a thick film only on the opposite side from the active layer. The output after continuous oscillation was measured and evaluated under the same conditions as above.

The results here were substantially the same as in FIG. 4.

For the sake of further comparison, a laser element was formed by substantially the same manufacturing method as for the above-mentioned semiconductor laser element, except that a single-layer film of $Al_2O_3$ (film thickness: 1500 Å), in which neither a thin film region was formed on the cavity end face nor a thick film part on the surface, was formed by ECR sputtering, instead of a first protective film composed of AlN and a second protective film composed of $SiO_2$. The output after continuous oscillation was measured under the same conditions as above.

Figure 9:
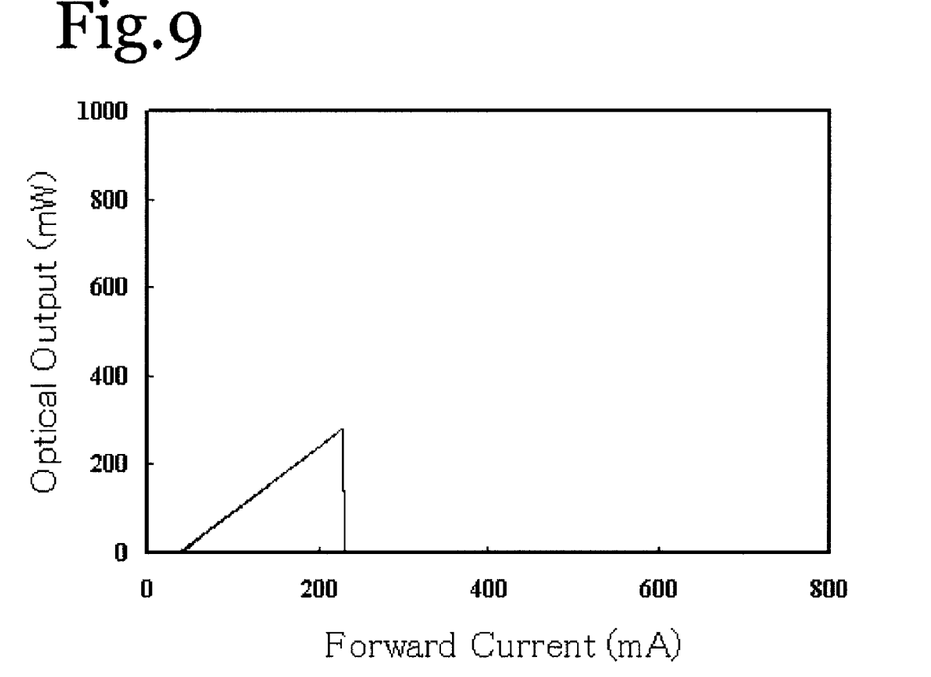
FIG. 9 is a graph showing COD level of the comparative laser element.

These results are given in FIG. 9.

It can be seen from FIG. 9 that with a laser element having neither a thin film region nor a thick film part protruding on both sides, the decrease in the COD level was markedly greater than with the laser element equipped with the above-mentioned first and second protective films.

Thus, the result of forming the first protective film having the thin film region and the second protective film having the thick film region on the cavity end face is that stress can be relieved in the light emitting portion of the nitride semiconductor layer constituting the cavity end face. Thus, no cracks form in the nitride semiconductor and the protective film, adhesion to the cavity end face and the end face protective film is good, separating is prevented, and this in turn increases the COD level.

To test the first protective film of the nitride semiconductor laser element thus obtained, a first film composed of AlN (100 Å thick) was formed by substantially the same method and from the same materials as above on an n-GaN substrate (M-axis orientation: M-plane), and a second film composed of $SiO_2$ (1500 Å thick) was formed thereon. The orientation of these films (such as the first film and the second film) thus obtained was measured using an XRD apparatus.

The result here was substantially the same as that of the first protective film of Example 1.

For the result of the second film, the vicinity of a specific angle corresponded to a peak and indicating orientation is not almost seen. This means that the second film indicate amorphous.

EXAMPLES 6 TO 11

In these examples, laser elements were produced in the same manner as in Example 1, except that the thickness was changed for the first protective film composed of AlN and for the second protective film having thick film parts protruding on both sides.

The laser element thus obtained had the first and second protective film composition and film thickness shown in the following table.

TABLE 1

|  | First Protective Film | Second Protective Film |
|---|---|---|
| Example 6 | AlN: 100 Å | SiO$_2$: 1350 Å |
| Example 7 | AlN: 100 Å | SiO$_2$: 2700 Å |
| Example 8 | AlN: 100 Å | SiO$_2$: 2500 Å |
| Example 9 | AlN: 320 Å | SiO$_2$: 2500 Å |
| Example 10 | AlN: 320 Å | SiO$_2$: 1100 Å |
| Example 11 | AlN: 1200 Å | SiO$_2$: 3000 Å |

Figure 10:
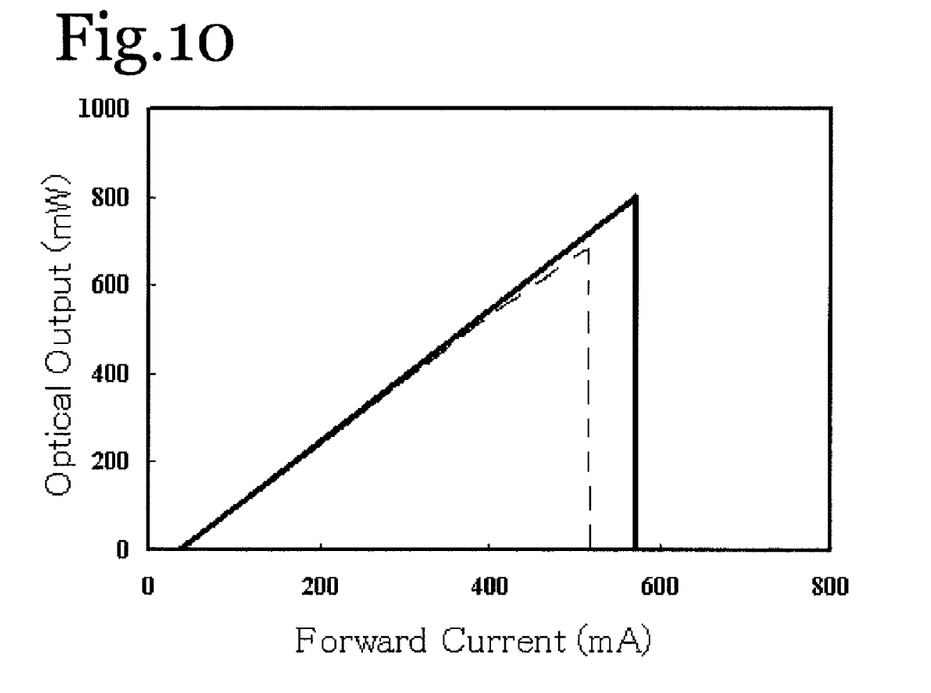
FIG. 10 is a graph showing COD level of the present invention.

These laser elements were evaluated in the same manner as in Example 5, some of the results of which are given in FIG. 10. The solid line in FIG. 10 shows the results for Example 7, and the dashed line shows those for Example 6.

In FIG. 10, it can be seen that the COD level was good in both Examples 6 and 7, just as with the laser element in Example 5. Also, although not shown, the COD level increased in Examples 8 to 11 in the same manner as in Example 5, and service life characteristics were found to be good.

It can be seen from these examples that the increase in COD level tends to be better when the first protective film is thinner. It can also be seen that the thickness of the second protective film tends to affect the increase in COD level.

EXAMPLE 12

In this example, instead of exposing a first protective film composed of AlN to laser light, the entire surface of the AlN film over the cavity end face is coated with a resist by a known method after forming a first protective film composed of AlN, the coating is pre-baked in air for 30 minutes at 90° C., this product is exposed to light through a mask that is open only in the so-called core region, this product is dry etched to make a thin film from the AlN film in the core region, the resist is removed, and then an SiO$_2$ film is formed as a second protective film in a thickness of 2500 Å in the same manner as in Example 1 over the first protective film having the thin film region, and this film is exposed to laser light to form a second protective film having a thick film part protruding on both sides.

The same effect as in Example 5 is also obtained in this Example.

EXAMPLE 13

This Example is the same as Example 5, except that the second protective film 26 is formed from Al$_2$O$_3$ (1100 Å thick).

Firstly, an AlN film is formed as the first protective film the same as that of Example 5, an Al$_2$O$_3$ film is then formed on the light exit face of the cavity end face in a thickness of 1100 Å using an Al target at a microwave power of 500 W, an RF power of 500 W, an oxygen flow of 5 sccm.

The same effect as in Example 5 is also obtained in this Example.

EXAMPLE 14

In Example 14, the nitride semiconductor laser element shown in FIG. 7 is formed.

More specifically, a first protective film 25 (first film) is composed of AlN and has a thickness of about 100 Å. A second film 25' is composed of GaN and has a thickness of about 100 Å. A second protective film is composed of Al$_2$O$_3$ and has a thickness of about 1100 Å. The thickness of the thin film region formed in the first film 25 is about 70 Å, and the maximum thickness is about 100 Å, which means that there is a depression of about 30 Å in the thin film region. The width of the thin film region is about 2.0 µm and the height is about 500 Å. The second film has a thin film region of the same size as the first film. The thickness of the thick film region formed in the second protective film 26 is about 2500 Å, and the thickness of the other region is about 2400 Å, the width at uppermost surface is about 2.1 µm and the height is about 600 Å. Other than this, a laser element is formed in the same manner as in Example 5.

Firstly, an AlN film is formed as the first protective film the same as that of Example 5, a GaN film is then formed as the second film 25' at a microwave power of 500 W, an RF power of 500 W, an argon flow of 30 sccm and a nitrogen flow of 10 sccm, and at a firm formation rate of 50 Å/min.

Next, an Al$_2$O$_3$ is formed on the light exit end face as a second protective film on the second film using an Al target at an RF power of 500 W, an oxygen flow of 5 sccm with a sputtering apparatus.

The same effect as in Example 5 is also obtained in this Example.

The present invention can be applied to a wide range of nitride semiconductor elements with which the protective film needs to adhere well to the semiconductor layer, such as in use as light emitting elements (e.g., LD, LED, super luminescence diode, etc.), solar cells, light-receptive elements (e.g., light sensor, etc.), electric devices (e.g., transistor, power device, etc.) and the like. In particular, it is useful as nitride semiconductor elements in optical disk applications, optical communications systems, printers, optical exposure applications, and various devices for measurement, excitation light source for bio-specific applications and the like.

This application claims priority to Japanese Patent Application Nos. 2007-46260 and 2007-48426. The entire disclosure of Japanese Patent Application Nos. 2007-46260 and 2007-48426 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. An edge emitting nitride semiconductor laser element having nitride semiconductor layers including a first nitride semiconductor layer, an active layer and a second nitride semiconductor layer laminated in a lamination direction, and a first protective film continuously covering a cavity end face of the nitride semiconductor layers with the cavity end face extending in a direction parallel to the lamination direction, the first protective film having a thin film region in which a film thickness of the first protective film, which is defined as a distance from the cavity end face to a top surface of the first protective film measured in a direction perpendicular to the lamination direction of the nitride semiconductor layers, increases with increasing distance from a position corresponding to the active layer in the direction parallel to the lamination direction of the nitride semiconductor layers, wherein a ridge is formed on a surface of the second nitride semiconductor layer to form an optical waveguide region, and the thin film region of the first protective film has a width that is larger than a width of the ridge as measured in the direction perpendicular to the lamination direction of the nitride semiconductor layers on a plane parallel to the cavity end face.

2. The laser element according to claim 1, wherein a ridge is formed on a surface of the second nitride semiconductor layer, and the first protective film has the thin film region under the ridge and nearby.

3. The laser element according to claim 1, wherein the first protective film is formed of a material having a hexagonal system crystal structure.

4. The laser element according to claim 1, wherein the first protective film is composed of nitride material.

5. The laser element according to claim 1, wherein the first protective film has the maximum thickness of 50 Å to 1000 Å.

6. The laser element according to claim 1, wherein the first protective film has a crystal structure that has the same axial orientation as that of the nitride semiconductor layers constituting the cavity end face.

7. The laser element according to claim 1, wherein the cavity end face is the M-plane(1-100), A-plane(11-20), C-plane(0001) or R-plane(1-102).

8. The laser element according to claim 1, wherein a second protective film is further formed on the first protective film.

9. The laser element according to claim 1, wherein the thin film region of the first protective film has a minimum thickness which is at least 5% thinner than a maximum thickness of the first protective film.

10. The laser element according to claim 1, wherein the thin film region of the first protective film corresponds to an optical waveguide region of the cavity end face.

11. The laser element according to claim 1, wherein the thin film region of the first protective film has a horizontally elliptical shape on the cavity end face.

12. The laser element according to claim 1, further comprising
a second protective film formed on the first protective film, wherein the second protective film has a thick part protruding from a face on the cavity end face side and from a face opposite the cavity end face with the thick part being disposed in a position corresponding to the thin film region of the first protective film.

13. The laser element according to claim 12, wherein the thick part of the second protective film is formed on an optical waveguide region of the cavity end face and nearby.

14. The laser element according to claim 12, wherein a ridge is formed on a surface of the second nitride semiconductor layer, and the second protective film has the thick part under the ridge and nearby.

15. The laser element according to claim 12, wherein the thick part has a horizontally elliptical shape on the cavity end face.

16. The laser element according to claim 12, wherein the thick part has a thickness which is at least 5% thicker than the other part of the second protective film.

17. The laser element according to claim 12, wherein the thick part of the second protective film has the thickness of 1000 Å to 3000 Å.

18. The laser element according to claim 12, wherein the second protective film is composed of oxide material.

19. The laser element according to claim 12, wherein the surface area of the thick part formed on a face on the cavity end face side is smaller than the surface area of the thick part formed on the opposite face.

20. The laser element according to claim 12, wherein the first protective film is formed of a material having a hexagonal system crystal structure.

21. The laser element according to claim 12, wherein the first protective film has a crystal structure that has the same axial orientation as that of the nitride semiconductor layers constituting the cavity end face.

22. The laser element according to claim 12, wherein the end face of the cavity is the M-plane(1-100), A-plane(11-20), C-plane(0001) or R-plane(1-102).

* * * * *